(12) United States Patent
Kim et al.

(10) Patent No.: US 12,543,439 B2
(45) Date of Patent: Feb. 3, 2026

(54) DISPLAY DEVICE

(71) Applicant: Samsung Display Co., LTD., Yongin-si (KR)

(72) Inventors: Keunwoo Kim, Seongnam-si (KR);
Taewook Kang, Seongnam-si (KR);
Yeoungkeol Woo, Hanam-si (KR);
Woo-Seok Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 499 days.

(21) Appl. No.: 18/089,457

(22) Filed: Dec. 27, 2022

(65) Prior Publication Data
US 2023/0309343 A1    Sep. 28, 2023

(30) Foreign Application Priority Data

Mar. 25, 2022    (KR) .......................... 10-2022-0037328

(51) Int. Cl.
   *H10K 59/121*    (2023.01)
(52) U.S. Cl.
   CPC ..... *H10K 59/1213* (2023.02); *H10K 59/1216* (2023.02)
(58) Field of Classification Search
   CPC ........... H10K 59/1213; H10K 59/1216; H10K 59/124; H10K 59/121; H10K 59/131; H10D 86/481; H10D 86/60; H10D 86/421
   See application file for complete search history.

(56) References Cited

U.S. PATENT DOCUMENTS

| | | | | |
|---|---|---|---|---|
| 5,552,615 A | * | 9/1996 | Kodaira | G02F 1/13454 257/E29.147 |
| 2007/0091217 A1 | * | 4/2007 | Zhang | G02F 1/13624 257/E27.111 |
| 2013/0119388 A1 | * | 5/2013 | Lee | H10D 86/481 438/34 |
| 2017/0323910 A1 | * | 11/2017 | Park | H10D 86/481 |
| 2018/0366493 A1 | * | 12/2018 | Jeong | H10D 86/441 |
| 2019/0115407 A1 | * | 4/2019 | Cho | H10D 86/423 |

(Continued)

FOREIGN PATENT DOCUMENTS

| | | |
|---|---|---|
| CN | 113363290 | 9/2021 |
| KR | 1020060124437 | 12/2006 |

(Continued)

*Primary Examiner* — Chad M Dicke
*Assistant Examiner* — Gary Abel
(74) *Attorney, Agent, or Firm* — CANTOR COLBURN LLP

(57) ABSTRACT

A display device includes a substrate, an active pattern disposed on the substrate, and including a first area, a second area, a (1-1)th channel area, a (1-2)th channel area, and a third area disposed between the (1-1)th channel area and the (1-2)th channel area, a first insulating layer disposed on the substrate and covering the active pattern, a second insulating layer which is disposed on the first insulating layer and in which an opening overlapping the (1-2)th channel area, the second area, and the third area is defined, a first gate electrode disposed on the first insulating layer and overlapping the (1-1)th channel area the (1-2)th channel area, respectively, and a high dielectric layer disposed on the first insulating layer and the second insulating layer, covering the first gate electrode, and filling the opening.

20 Claims, 19 Drawing Sheets

(56) References Cited

U.S. PATENT DOCUMENTS

| | | | |
|---|---|---|---|
| 2020/0381504 A1* | 12/2020 | An | .................. G09G 3/3275 |
| 2021/0057506 A1* | 2/2021 | Jo | .................. H10K 59/1216 |
| 2021/0280652 A1 | 9/2021 | Kim et al. | |
| 2023/0007202 A1* | 1/2023 | Kato | .................. H04N 25/75 |

FOREIGN PATENT DOCUMENTS

| | | |
|---|---|---|
| KR | 1020200067221 | 6/2020 |
| KR | 1020200110554 | 9/2020 |
| KR | 1020210113513 | 9/2021 |

\* cited by examiner

FIG. 4
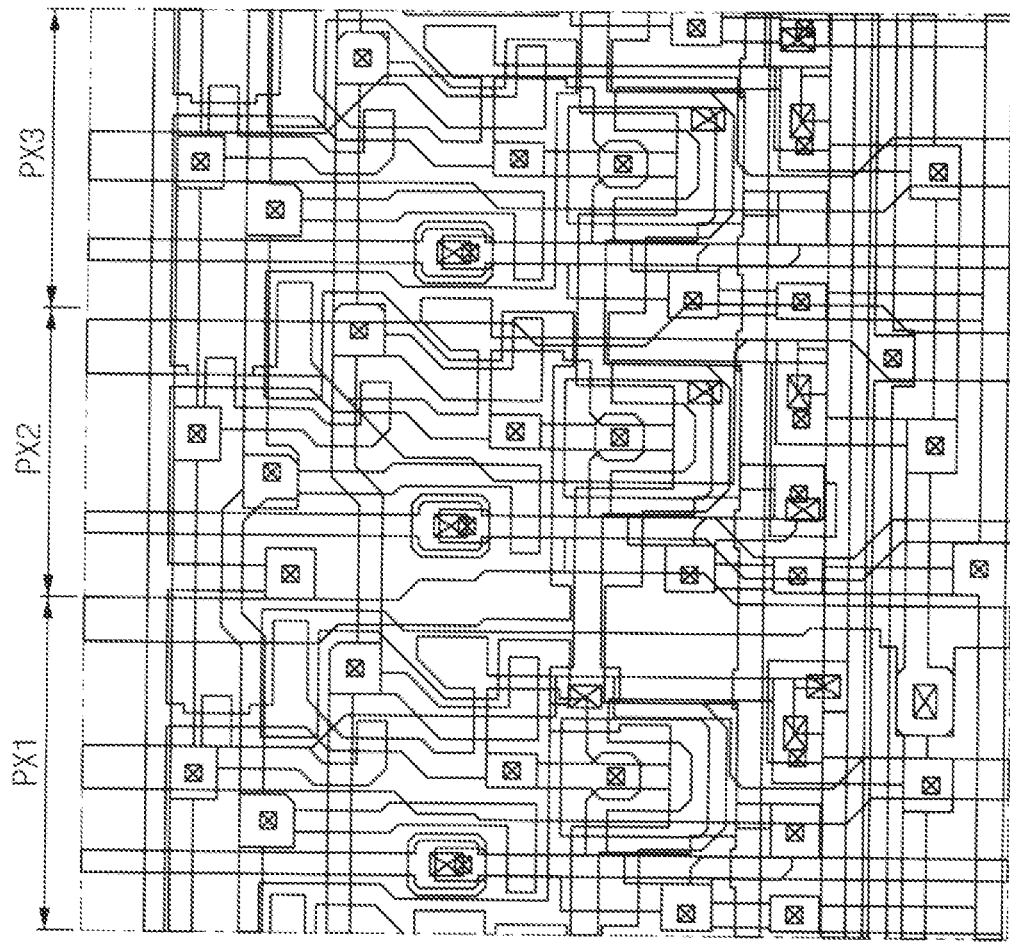
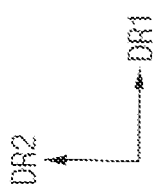

FIG. 16
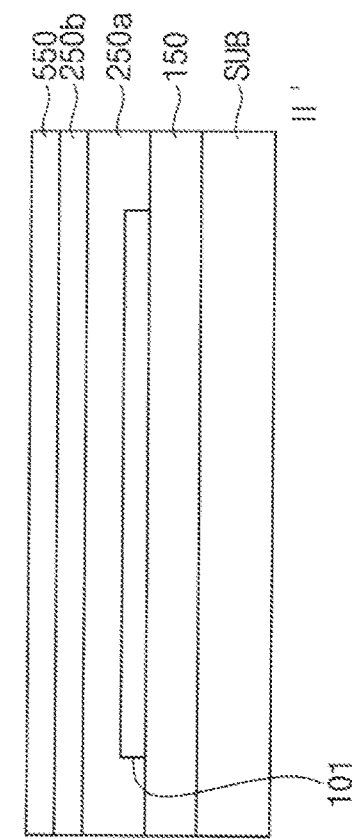
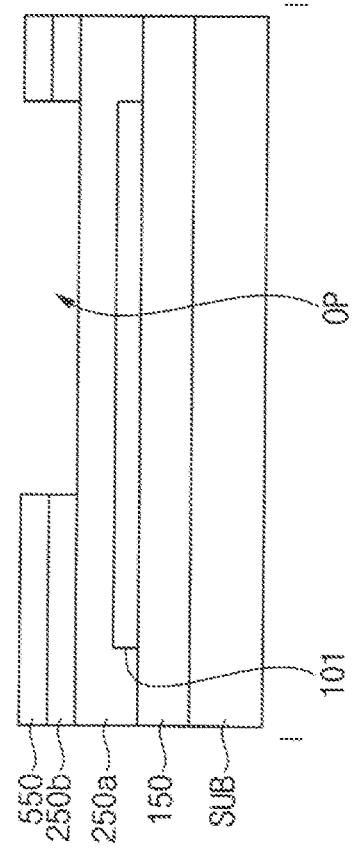

DISPLAY DEVICE

This application claims priority to Korean Patent Application No. 10-2022-0037328, filed on Mar. 25, 2022, and all the benefits accruing therefrom under 35 U.S.C. § 119, the content of which in its entirety is herein incorporated by reference.

BACKGROUND

1. Field

Embodiments provide generally to display device. More particularly, embodiments relate to a display device that provides visual information.

2. Description of the Related Art

With a development of information technology, an importance of a display device as a connection medium between a user and information is being highlighted. Accordingly, a use of display devices such as liquid crystal display device ("LCD"), an organic light-emitting display device ("OLED"), a plasma display device ("PDP"), quantum dot display device, or the like is increasing.

The display device includes a plurality of pixels, and each of the pixels includes a plurality of transistors and a storage capacitor. The plurality of transistors includes a switching transistor and a driving transistor, for example.

SUMMARY

A display device may emit light using various signals. Current may leak while these signals are transmitted to a light-emitting element. In this case, the light-emitting performance of the display device may be deteriorated.

In addition, the driving transistor is desired to have a wide driving range of the gate voltage in order to control the gate voltage of the driving transistor to have a rich gray level.

Embodiments provide a display device with improved display quality.

A display device in embodiments of the invention includes a substrate, an active pattern disposed on the substrate, and including a first area, a second area, a (1-1)th channel area, a (1-2)th channel area, and a third area disposed between the (1-1)th channel area and the (1-2)th channel area, a first insulating layer disposed on the substrate and covering the active pattern, a second insulating layer which is disposed on the first insulating layer and in which an opening overlapping the (1-2)th channel area, the second area, and the third area is defined, a first gate electrode disposed on the first insulating layer and overlapping the (1-1)th channel area the (1-2)th channel area, respectively, and a high dielectric layer disposed on the first insulating layer and the second insulating layer, covering the first gate electrode, and filling the opening.

In an embodiment, the high dielectric layer may include at least one of aluminum oxide ($Al_2O_3$), zirconium oxide (ZrO), and hafnium oxide ($HfO_2$).

In an embodiment, the first insulating layer and the second insulating layer may include different inorganic materials.

In an embodiment, the first insulating layer may include silicon oxide ($SiO_x$) and the second insulating layer may include silicon nitride ($SiN_x$).

In an embodiment, a thickness of the first insulating layer may be different from a thickness of the second insulating layer.

In an embodiment, the thickness of the first insulating layer may be about 800 angstroms (Å) to about 1,400 Å and the thickness of the second insulating layer may be about 200 Å to about 600 Å.

In an embodiment, a thickness of the high dielectric layer may be about 300 Å to about 1,000 Å.

In an embodiment, the first gate electrode may include a first portion overlapping the (1-1)th channel area and disposed on the second insulating layer and a second portion overlapping the (1-2)th channel area and disposed on the first insulating layer.

In an embodiment, the first portion of the first gate electrode together with first area, the (1-1)th channel area, and a portion of the third area of the active pattern may constitute a (1-1)th switching transistor. The second portion of the first gate electrode together with the second area, the (1-2)th channel area, and a portion of the third area of the active pattern may constitute a (1-2)th switching transistor.

In an embodiment, the display device may further include a third insulating layer and a capacitor electrode. The third insulating layer may be disposed on the high dielectric layer and including at least one of silicon oxide, silicon nitride, and silicon oxynitride. The capacitor electrode may be disposed on the third insulating layer.

In an embodiment, a thickness of the third insulating layer may be about 500 Å to about 1,400 Å.

In an embodiment, a portion of the capacitor electrode overlapping the third area of the active pattern together with the third area of the active pattern may constitute a node capacitor.

In an embodiment, the active pattern may further include a fourth area, a fifth area, and a second channel area disposed between the fourth area and the fifth area.

In an embodiment, the display device may further include a second gate electrode disposed in a same layer as the first gate electrode, overlapping the second channel area, and covered by the high dielectric layer. The second gate electrode together with the fourth area, the fifth area, and the second channel area of the active pattern may constitute a driving transistor.

In an embodiment, a portion of the capacitor electrode overlapping the second gate electrode together with the second gate electrode may constitute a storage capacitor.

In an embodiment, the active pattern may include at least one of polysilicon and amorphous silicon.

A display device in embodiments of the invention includes a substrate, an active pattern disposed on the substrate, and including a first area, a second area, a (1-1)th channel area, a (1-2)th channel area, and a third area disposed between the (1-1)th channel area and the (1-2)th channel area, a first insulating layer disposed on the substrate and covering the active pattern, a second insulating layer which is disposed on the first insulating layer and in which an opening overlapping the (1-2)th channel area, the second area, and the third area is defined, a capacitor electrode disposed on the first insulating layer, at least a portion of the capacitor electrode constituting a node capacitor together with the third area of the active pattern, and a high dielectric layer disposed between the first insulating layer and the capacitor electrode and filling the opening.

In an embodiment, the high dielectric layer may include at least one of aluminum oxide ($Al_2O_3$), zirconium oxide (ZrO), and hafnium oxide ($HfO_2$).

In an embodiment, the display device may further include a gate electrode including a first portion disposed between the second insulating layer and the high dielectric layer and overlapping the (1-1)th channel area and a second portion disposed between the first insulating layer and the high dielectric layer and overlapping the (1-2)th channel area.

In an embodiment, the first portion of the first gate electrode together with first area, the (1-1)th channel area, and a portion of the third area of the active pattern may constitute a (1-1)th switching transistor. The second portion of the first gate electrode together with the second area, the (1-2)th channel area, and a portion of the third area of the active pattern may constitute a (1-2)th switching transistor.

A display device in an embodiment of the disclosure may include an insulating layer disposed on a substrate and having an opening overlapping a portion of an active pattern constituting a (1-2)th switching transistor, and a high dielectric layer filling the opening and including a material with a high dielectric constant. A node capacitor composed of the active pattern and a capacitor electrode overlapping a portion of the active pattern constituting a (1-2)th switching transistor may be increased. In this case, since a leakage current flowing through the (1-2)th switching transistor is greater than a leakage current flowing through the (1-1)th switching transistor, the leakage current flowing through the (1-1)th switching transistor may be reduced. In addition, a wide driving range of a driving transistor may be secured.

BRIEF DESCRIPTION OF THE DRAWINGS

Illustrative, non-limiting embodiments will be more clearly understood from the following detailed description in conjunction with the accompanying drawings.

FIG. 4 is a plan view illustrating pixels included in the display device of FIG. 1.

FIGS. 14, 15, 16, 17, 18, 19, and 20 are cross-sectional views illustrating an embodiment of a method of manufacturing a display device.

DETAILED DESCRIPTION

Figure 1:
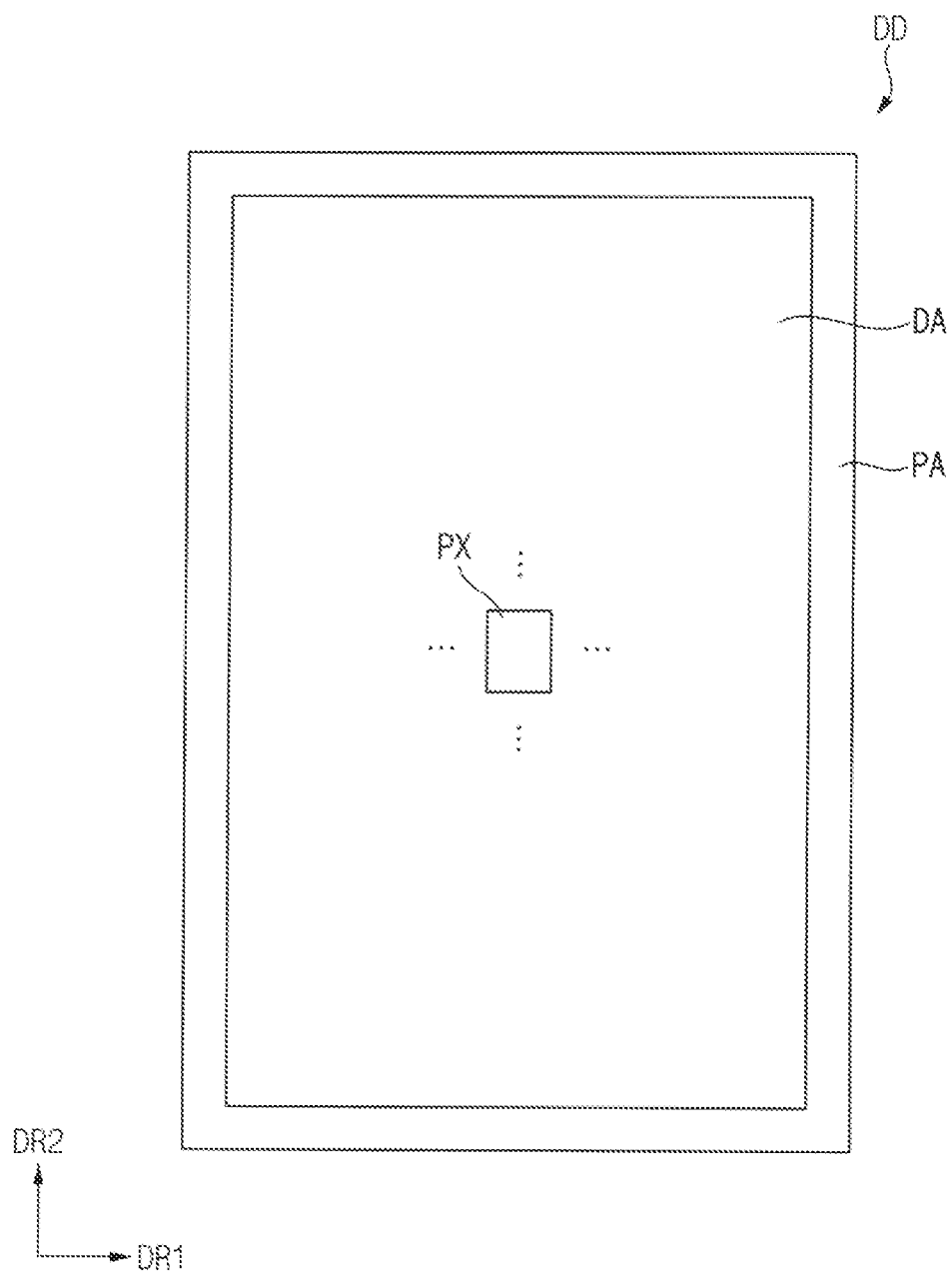
FIG. 1 is a plan view illustrating an embodiment of a display device.

Hereinafter, embodiments of the disclosure will be explained in detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view illustrating an embodiment of a display device.

Referring to FIG. 1, the display device DD in an embodiment may include a display area DA and a peripheral area PA. The display area DA may be defined as an area capable of displaying an image by generating light or adjusting transmittance of light provided from an external light source. The peripheral area PA may be defined as an area that does not display an image. In addition, the peripheral area PA may surround at least a portion of the display area DA.

In an embodiment, the peripheral area PA may surround an entirety of the display area DA, for example.

A plurality of pixels PX may be disposed in the display area DA. In an embodiment, each of the pixels PX may include a driving element (e.g., a transistor, or the like) and a light-emitting element (e.g., a light-emitting diode, or the like) electrically connected to the driving element, for example. The light-emitting element may emit light by receiving a signal from the driving device. As such, the display device DD may display an image by emitting light from the plurality of pixels PX.

One pixel PX may display one predetermined basic color. In other words, one pixel PX may be a minimum unit capable of displaying colors independent of other pixels PX. In an embodiment, one pixel PX may display any one of red color, green color, and blue color, for example.

The plurality of pixels PX may be arranged in a matrix form along a first direction DR1 and a second direction DR2 crossing the first direction DR1. In an embodiment, the first direction DR1 and the second direction DR2 may be orthogonal to each other, for example. However, the disclosure is not limited thereto, and the plurality of pixels PX may be arranged in various other forms.

A driver for driving the plurality of pixels PX may be disposed in the peripheral area PA. In an embodiment, the driver may include a data driver, a gate driver, a light-emitting driver, a power voltage generator, a timing controller, or the like, for example. The plurality of pixels PX may emit light based on signals received from the drivers.

Figure 2:
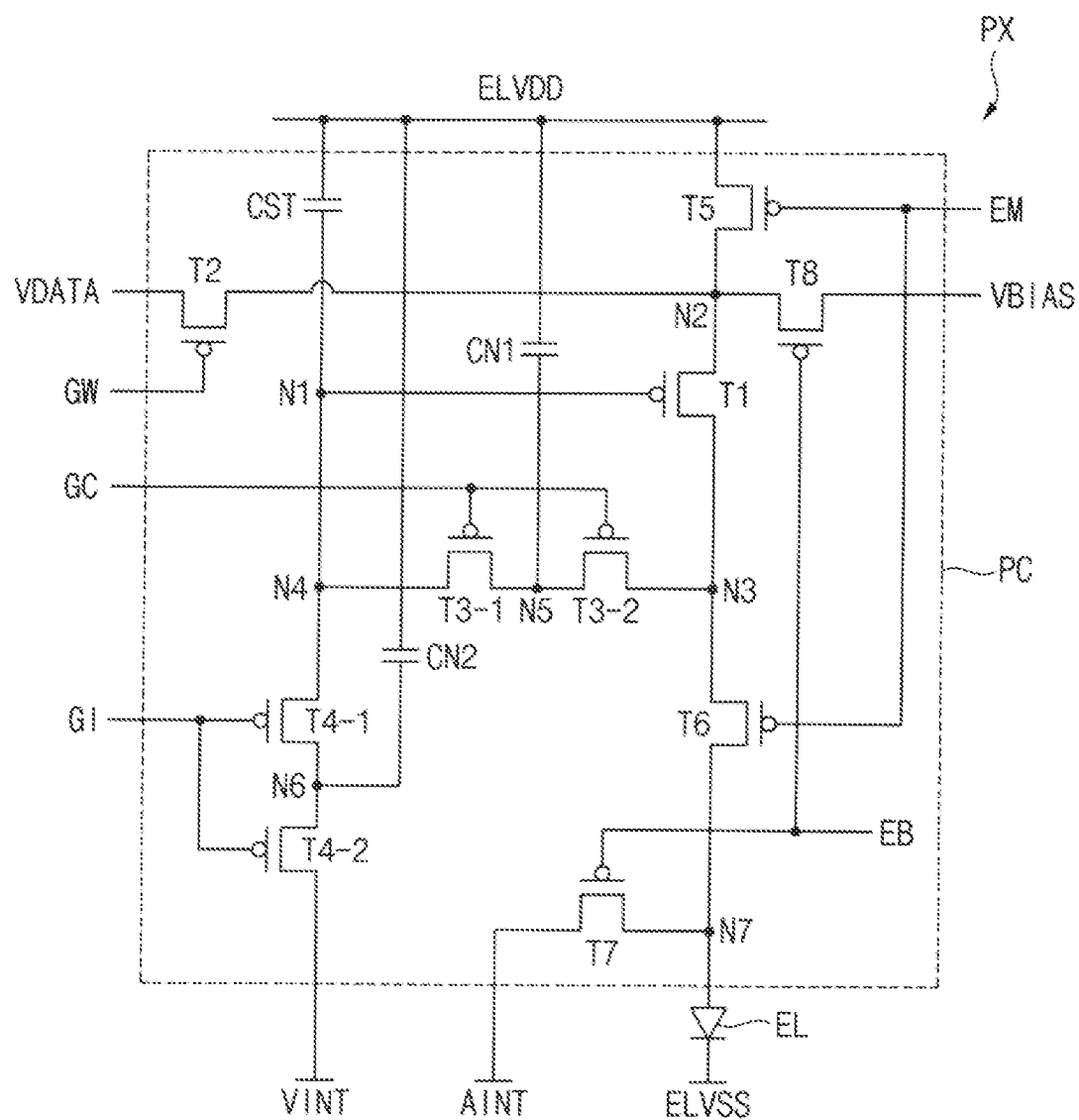
FIG. 2 is a circuit diagram illustrating a pixel of the display device of FIG. 1.

FIG. 2 is a circuit diagram illustrating a pixel of the display device of FIG. 1.

Referring to FIGS. 1 and 2, each of the pixels PX may include a pixel circuit PC and a light-emitting element EL. The pixel circuit PC may be connected to the light-emitting element EL. The pixel circuit PC may include first to eighth transistors T1, T2, T3-1, T3-2, T4-1, T4-2, T5, T6, T7, and T8, a storage capacitor CST, a first node capacitor CN1 and a second node capacitor CN2.

The first transistor T1 may include a gate electrode, a first electrode, and a second electrode. The gate electrode of the first transistor T1 may be connected to a first node N1. The first electrode of the first transistor T1 may be connected to a second node N2. The second electrode of the first transistor T1 may be connected to a third node N3.

The first transistor T1 may generate a driving current based on a difference between a data voltage VDATA and a driving voltage ELVDD. The first transistor T1 may provide the driving current to the light-emitting element EL.

The second transistor T2 may include a gate electrode, a first electrode, and a second electrode. A data write signal GW may be applied to the gate electrode of the second transistor T2. The data voltage VDATA may be applied to the first electrode of the second transistor T2. The second electrode of the second transistor T2 may be connected to the second node N2. The second transistor T2 may provide the data voltage VDATA to the second node N2 in response to the data write signal GW.

The (3-1)th transistor T3-1 may include a gate electrode, a first electrode, and a second electrode. A compensation gate signal GC may be applied to the gate electrode of the (3-1)th transistor T3-1. The first electrode of the (3-1)th transistor T3-1 may be connected to a fourth node N4. The second electrode of the (3-1)th transistor T3-1 may be connected to a fifth node N5.

The (3-2)th transistor T3-2 may include a gate electrode, a first electrode, and a second electrode. The compensation gate signal GC may be applied to the gate electrode of the (3-2)th transistor T3-2. The first electrode of the (3-2)th transistor T3-2 may be connected to the fifth node N5. The second electrode of the (3-2)th transistor T3-2 may be connected to the third node N3.

As a third transistor including the (3-1)th transistor T3-1 and the (3-2)th transistor T3-2 is configured as a dual transistor, a leakage current generated in the pixel circuit PC may be prevented. The third transistor may compensate a threshold voltage of the first transistor T1 by diode-connecting the first transistor T1 in response to the compensation gate signal GC.

The (4-1)th transistor T4-1 may include a gate electrode, a first electrode, and a second electrode. An initialization gate signal GI may be applied to the gate electrode of the (4-1)th transistor T4-1. The first electrode of the (4-1)th transistor T4-1 may be connected to the fourth node N4. The second electrode of the (4-1)th transistor T4-1 may be connected to a sixth node N6.

The (4-2)th transistor T4-2 may include a gate electrode, a first electrode, and a second electrode. An initialization gate signal GI may be applied to the gate electrode of the (4-2)th transistor T4-2. The first electrode of the (4-2)th transistor T4-2 may be connected to the sixth node N6. An initialization voltage VNIT may be applied to the second electrode of the (4-2)th transistor T-2.

A fourth transistor including the (4-1)th transistor T4-1 and the (4-2)th transistor T4-2 may be configured as a dual transistor. The fourth transistor may provide the initialization voltage VINT to the gate electrode of the first transistor T1 in response to the initialization gate signal GI.

The fifth transistor T5 may include a gate electrode, a first electrode, and a second electrode. An emission control signal EM may be applied to the gate electrode of the fifth transistor T5. The driving voltage ELVDD may be applied to the first electrode of the fifth transistor T5. The second electrode of the fifth transistor T5 may be connected to the second node N2.

The sixth transistor T6 may include a gate electrode, a first electrode, and a second electrode. The emission control signal EM may be applied to the gate electrode of the sixth transistor T6. The first electrode of the sixth transistor T6 may be connected to the third node N3. The second electrode of the sixth transistor T6 may be connected to the seventh node N7.

Each of the fifth and sixth transistors T5 and T6 may provide the driving current generated by the first transistor T1 to the light-emitting element EL in response to the emission control signal EM.

The seventh transistor T7 may include a gate electrode, a first electrode, and a second electrode. A bias control signal EB may be applied to the gate electrode of the seventh transistor T7. The first electrode of the seventh transistor T7 may be connected to the seventh node N7. An anode initialization voltage AINT may be applied to the second electrode of the seventh transistor T7. The seventh transistor T7 may provide the anode initialization voltage AINT to the anode electrode of the light-emitting element EL in response to the bypass control signal EB.

The eighth transistor T8 may include a gate electrode, a first electrode, and a second electrode. The bypass control signal EB may be applied to the gate electrode of the eighth transistor T8. The first electrode of the eighth transistor T8 may be connected to the second node N2. A bias voltage VBIAS may be applied to the second electrode of the eighth transistor T8. The eighth transistor T8 may provide the bias voltage VBIAS to the second node N2 in response to the bypass control signal EB.

The storage capacitor CST may include a first electrode and a second electrode. The driving voltage ELVDD may be applied to the first electrode of the storage capacitor CST. The second electrode of the storage capacitor CST may be connected to the first node N1.

The first node capacitor CN1 may include a first electrode and a second electrode. The driving voltage ELVDD may be applied to the first electrode of the first node capacitor CN1. The second electrode of the first node capacitor CN1 may be connected to the fifth node N5 between the third transistors T3-1 and T3-2.

The second node capacitor CN2 may include a first electrode and a second electrode. The driving voltage ELVDD may be applied to the first electrode of the second node capacitor CN2. The second electrode of the second node capacitor CN2 may be connected to the sixth node N6 between the fourth transistors T4-1 and T4-2.

The light-emitting element EL may include an anode electrode and a cathode electrode. The anode electrode of the light-emitting element EL may be connected to the seventh node N7. A common voltage ELVSS may be applied to the cathode electrode of the light-emitting element EL. The voltage level of the common voltage ELVSS may be lower than the voltage level of the driving voltage ELVDD. The light-emitting element EL may emit light based on the driving current.

However, although each of the pixels PX of the invention has been described as including eight transistors, one storage capacitor, and two node capacitors, the configuration of the invention is not limited thereto. In an embodiment, each of the pixels PX may have a configuration including at least one transistor, at least one storage capacitor, and at least one node capacitor, for example.

Figure 3:
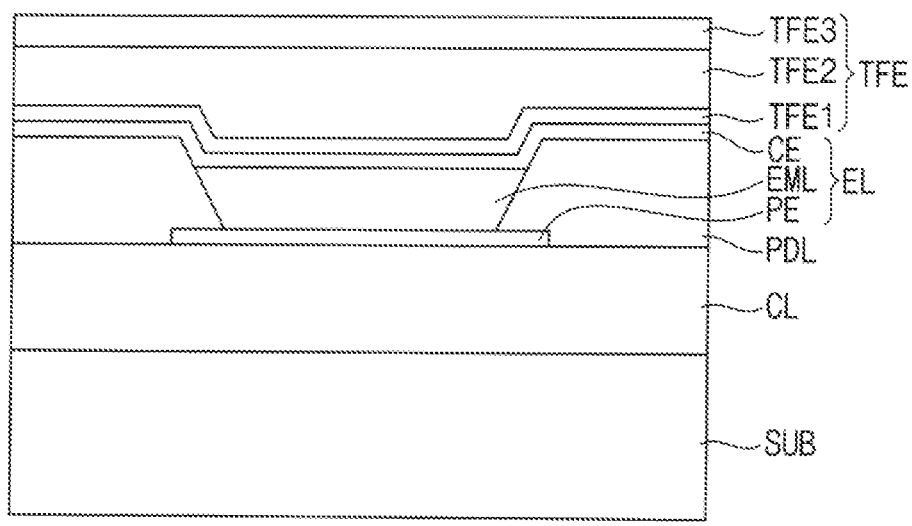
FIG. 3 is a cross-sectional view illustrating an embodiment of the display device of FIG. 1.

FIG. 3 is a cross-sectional view illustrating an embodiment of the display device of FIG. 1. FIG. 3 schematically illustrates an embodiment of a cross-section of the display area DA, for example.

Referring to FIG. 3, the display device DD in an embodiment may include a substrate SUB, a circuit layer CL, a light-emitting element EL, a pixel defining layer PDL, and an encapsulation layer TFE.

The substrate SUB may include a transparent material or an opaque material. The substrate SUB may include a transparent resin substrate. An embodiment of the transparent resin substrate may include a polyimide substrate or the like. In this case, the polyimide substrate may include a first organic layer, a first barrier layer, a second organic layer, or the like. In an alternative embodiment, the substrate SUB may include a quartz substrate, a synthetic quartz substrate, a calcium fluoride substrate, an F-doped quartz substrate, a soda-lime substrate, a non-alkali glass substrate, or the like. These may be used alone or in combination with each other.

The circuit layer CL may be disposed on the substrate SUB. The circuit layer CL may provide signals and voltages for the light-emitting element EL to emit light to the light-emitting element EL. In an embodiment, the circuit layer CL may include a transistor, a conductive layer, an insulating layer, or the like, for example.

The pixel electrode PE may be disposed on the circuit layer CL. The pixel electrode PE may receive the signals and the voltages from the circuit layer CL. In an embodiment, the pixel electrode PE may include a metal, an alloy, a metal nitride, a conductive metal oxide, a transparent conductive material, or the like, for example. These may be used alone or in combination with each other. In an embodiment, the pixel electrode PE may be an anode electrode, for example. In an alternative embodiment, the pixel electrode PE may be a cathode electrode.

The pixel defining layer PDL may be disposed on the circuit layer CL and the pixel electrode PE. An opening exposing a portion of the pixel electrode PE may be defined in the pixel defining layer PDL. Since the pixel defining layer PDL has the opening, the pixel defining layer PDL may define each pixel PX that emits light. The pixel defining layer PDL may include an organic material or an inorganic material. In an embodiment, the organic material that may be used as the pixel defining layer PDL may include photoresist, polyacrylic resin, polyimide resin, polyamide resin, siloxane resin, acrylic resin, epoxy resin, or the like. These may be used alone or in combination with each other.

The light-emitting layer EML may be disposed on the pixel electrode PE. Specifically, the light-emitting layer EML may be disposed in the opening of the pixel defining layer PDL. The light-emitting layer EML may include materials for emitting light. In an embodiment, the light-emitting layer EML may include an organic light-emitting material or an inorganic light-emitting material, for example.

The common electrode CE may be disposed on the pixel defining layer PDL and the light-emitting layer (also referred to as an emission layer) EML. In an embodiment, the common electrode CE may include a metal, an alloy, a metal nitride, a conductive metal oxide, a transparent conductive material, or the like. These may be used alone or in combination with each other. In an embodiment, the common electrode CE may be a cathode electrode, for example. In an alternative embodiment, the common electrode CE may be an anode electrode, for example.

Accordingly, the light-emitting element EL including the pixel electrode PE, the emission layer EML, and the common electrode CE may be disposed on the substrate SUB.

The encapsulation layer TFE may be disposed on the common electrode CE. The encapsulation layer TFE may protect the light-emitting element EL from external oxygen and moisture. The encapsulation layer TFE may include at least one inorganic layer and at least one organic layer. In an embodiment, the encapsulation layer TFE may include a first inorganic layer TFE1 disposed on the common electrode CE, an organic layer TFE2 disposed on the first inorganic layer TFE1, and a second inorganic layer TFE3 disposed on the organic layer TFE2, for example.

FIG. 4 is a plan view illustrating an embodiment of pixels included in the display device of FIG. 1. In an embodiment, FIG. 4 may be a plan view illustrating the circuit layer CL of FIG. 3, for example. The light-emitting element EL of FIG. 3 may be disposed on the plan view illustrated in FIG. 4.

Referring to FIGS. 1 and 4, the plurality of pixels PX may include a first pixel PX1, a second pixel PX2, and a third pixel PX3. In an embodiment, the first pixel PX1 may emit green light, the second pixel PX2 may emit red light, and the third pixel PX3 may emit blue light, for example. However, the color of the light emitted by each of the first pixel PX1, the second pixel PX2, and the third pixel PX3 is not limited thereto. The first pixel PX1, the second pixel PX2, and the third pixel PX3 may include the same component.

Hereinafter, since the first pixel PX1, the second pixel PX2, and the third pixel PX3 have the same component, one pixel (e.g., the first pixel PX1) will be described in detail.

FIGS. 5, 6, 7, 8, 9, 10, and 11 are plan views illustrating the components shown in the plan view of FIG. 4 for each layer.

Figure 5:
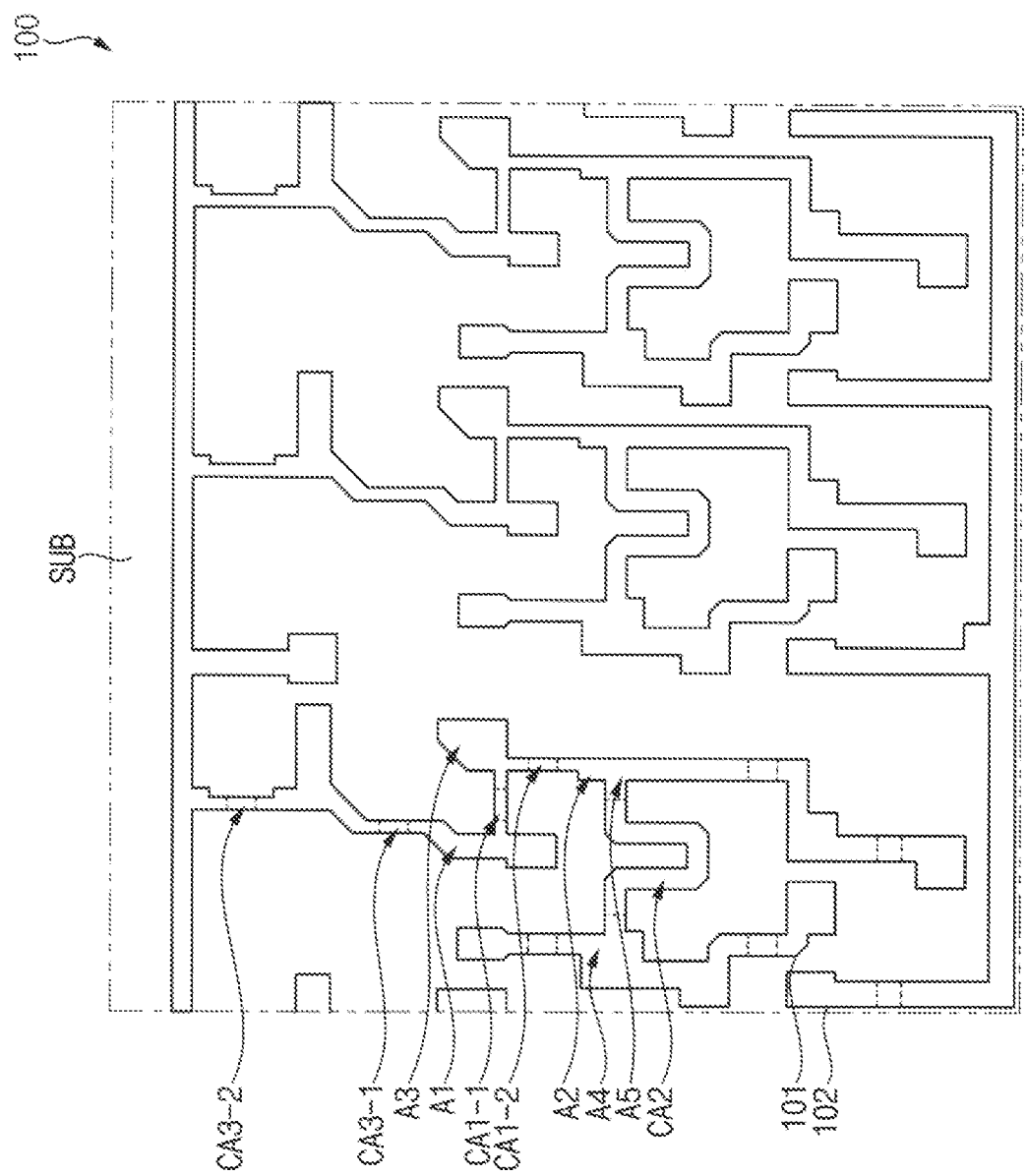
FIGS. 5, 6, 7, 8, 9, 10, and 11 are plan views illustrating the components shown in the plan view of FIG. 4 for each layer.
Figure 6:
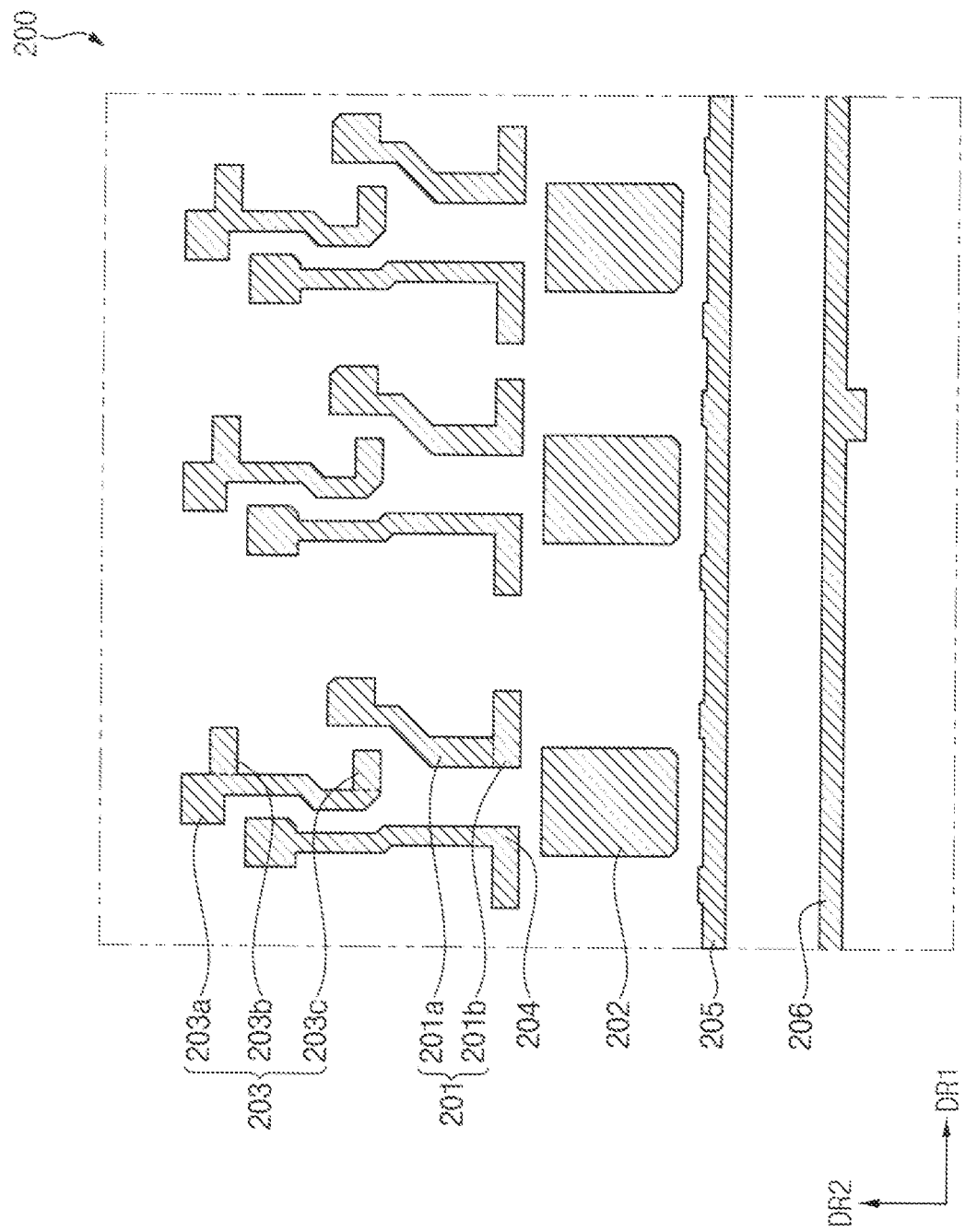
Figure 7:
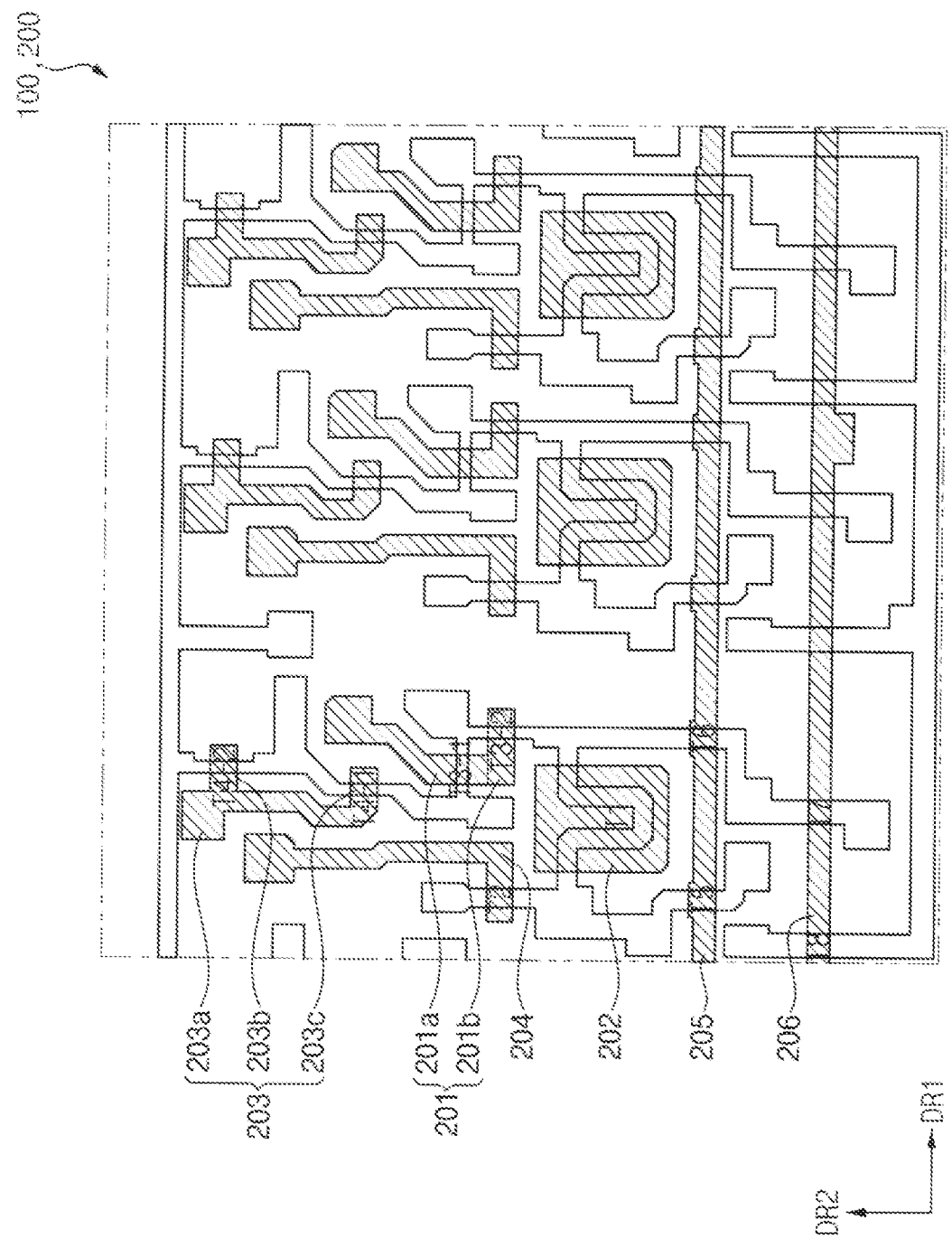
Figure 8:
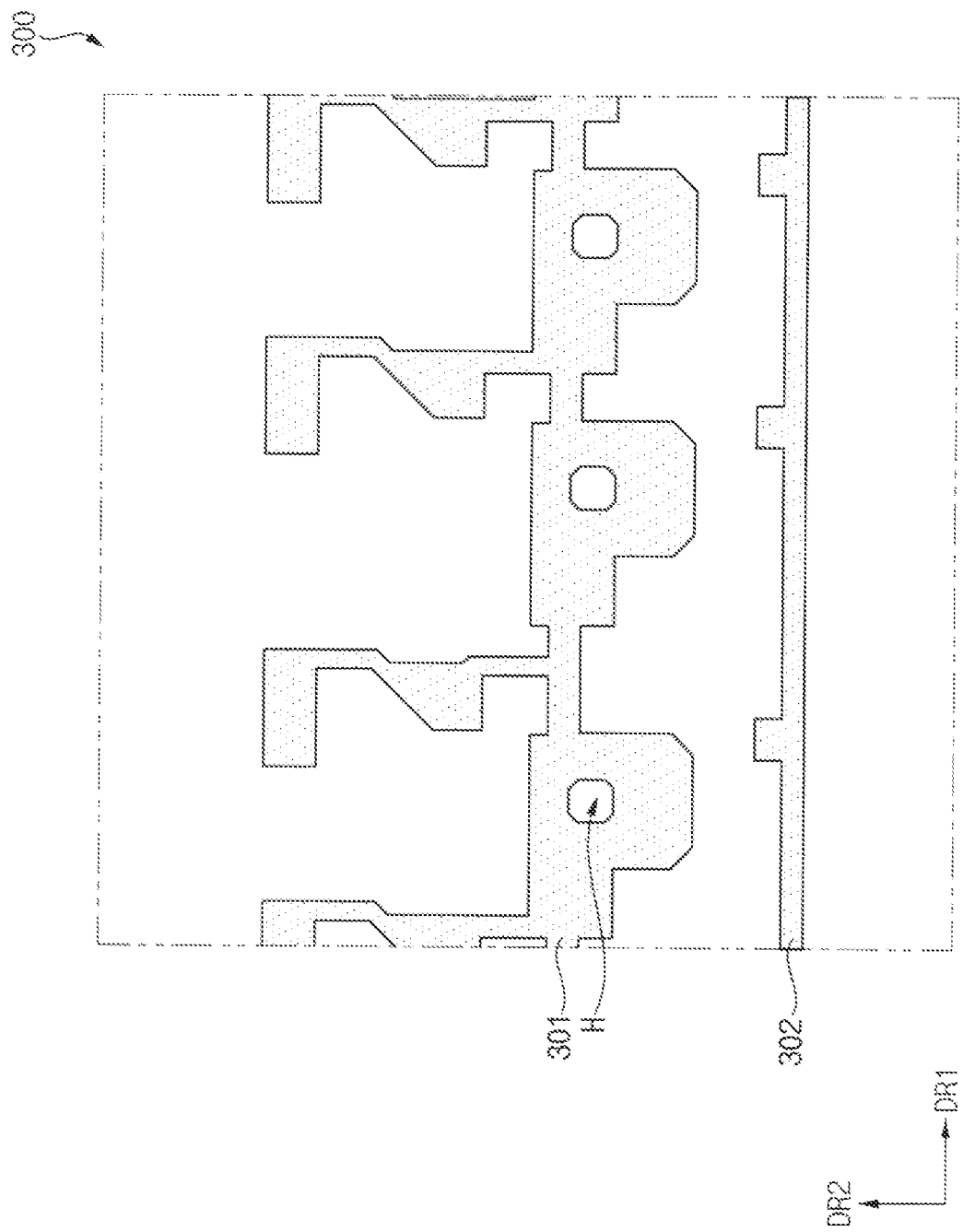
Figure 9:
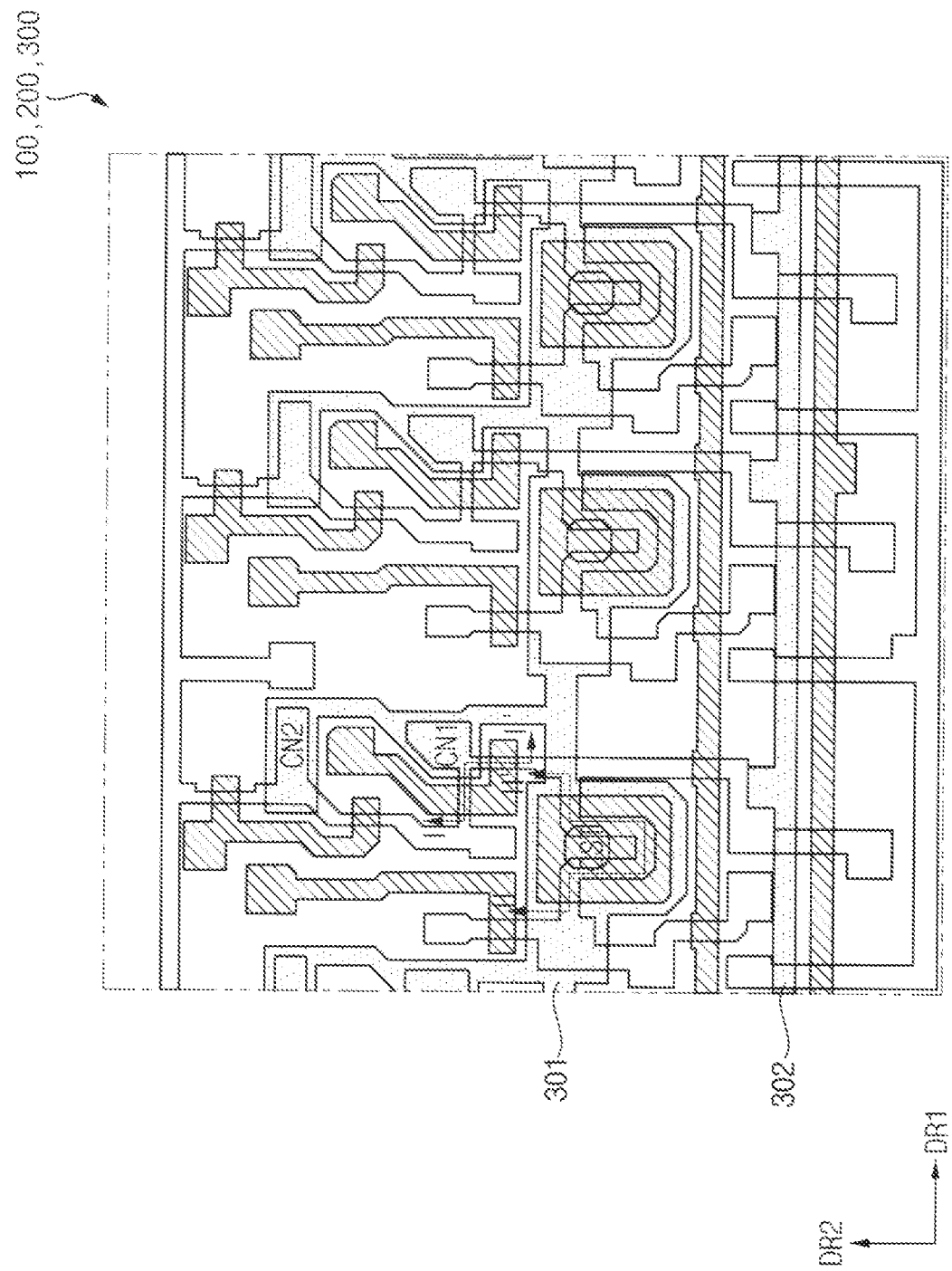
Figure 10:
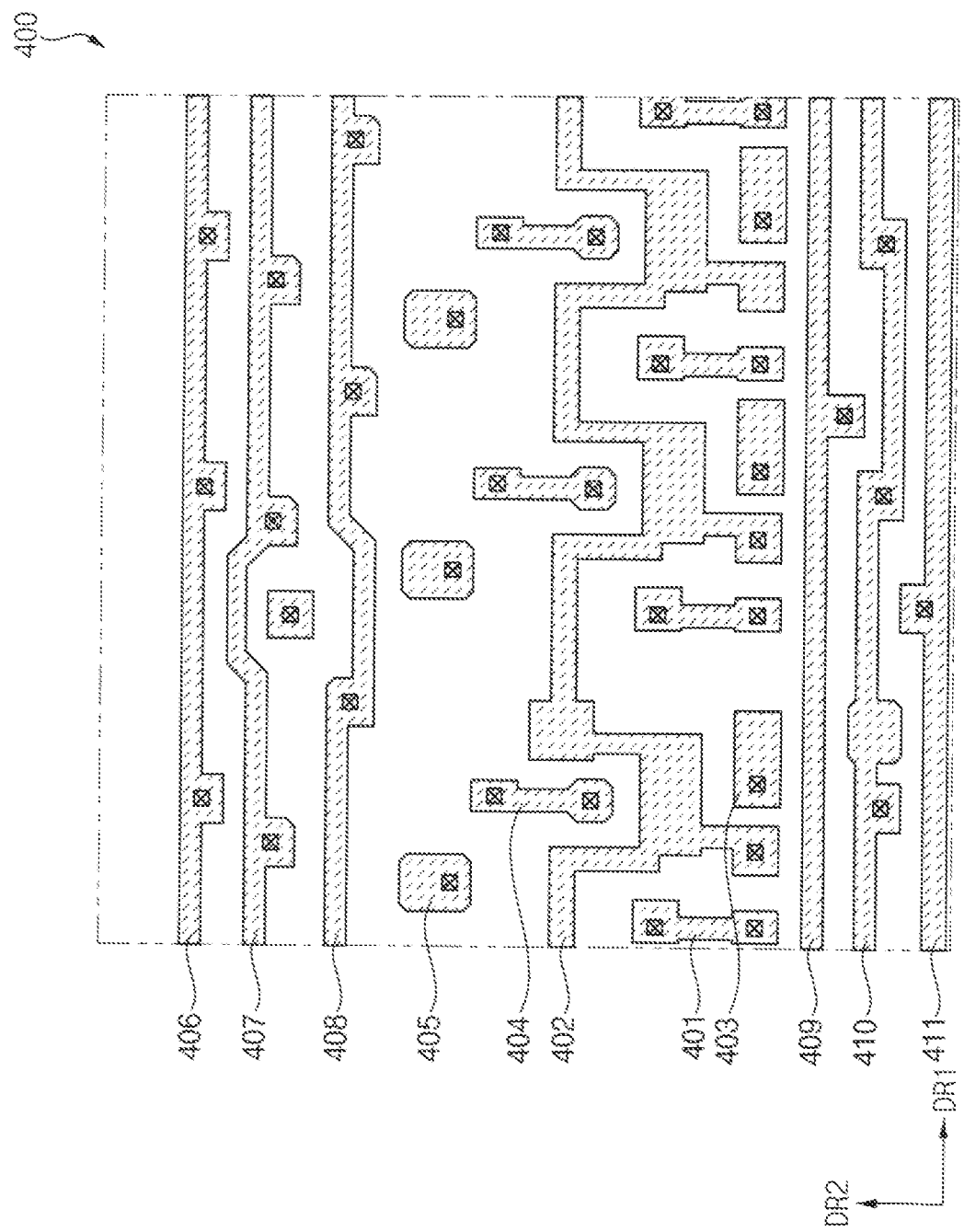
Figure 11:
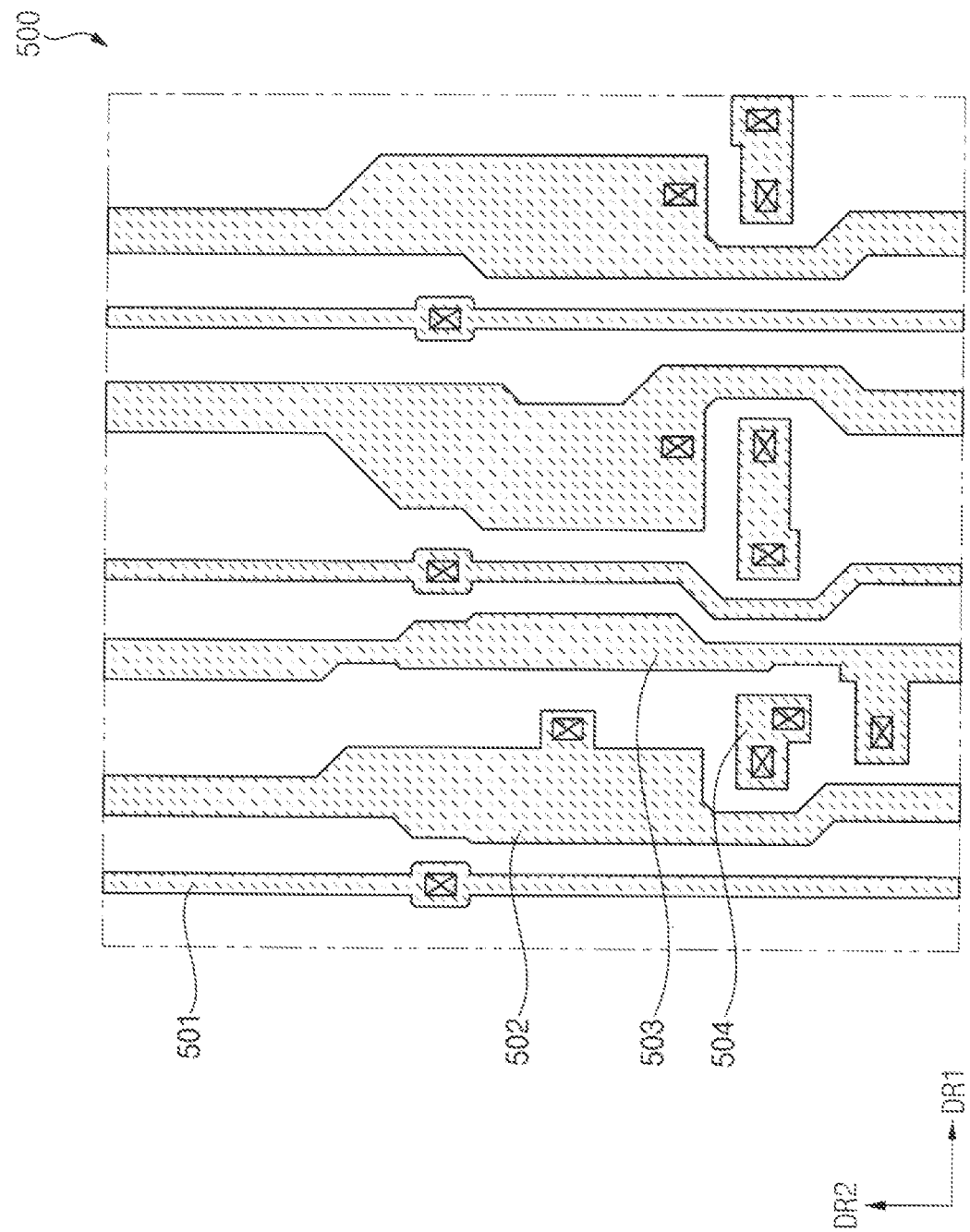

In an embodiment, FIG. 5 is a plan view illustrating an active layer 100 of FIG. 4. FIG. 6 is a plan view illustrating a first conductive layer 200 of FIG. 4. FIG. 7 is a plan view illustrating the active layer 100 and the first conductive layer 200 of FIG. 4. FIG. 8 is a plan view illustrating a second conductive layer 300 of FIG. 4. FIG. 9 is a plan view illustrating the active layer 100, the first conductive layer 200, and the second conductive layer 300 of FIG. 4. FIG. 10 is a plan view illustrating a third conductive layer 400 of FIG. 4. FIG. 11 is a plan view illustrating a fourth conductive layer 500 of FIG. 4.

Referring to FIGS. 3, 4, and 5, the display device DD in an embodiment may further include the active layer 100. The active layer 100 may be disposed on the substrate SUB. Specifically, a buffer layer may be disposed on the substrate SUB, and the active layer 100 may be disposed on the buffer layer.

The active layer 100 may include a first active pattern 101 and a second active pattern 102. The first active pattern 101 and the second active pattern 102 may be disposed in the same layer. The first active pattern 101 and the second active pattern 102 may have different shapes in a plan view.

The first active pattern 101 may include a (1-1)th channel area CA1-1, a (1-2)th channel area CA1-2, a second channel area CA2, and a (3-1)th channel area CA3-1, and a (3-2)th channel area CA3-2 spaced apart from each other.

The first active pattern 101 may further include a first area A1, a second area A2, a third area A3, a fourth area A4, and a fifth area A5 spaced apart from each other. The first area A1 may be disposed adjacent to each of the (1-1)th channel area CA1-1 and the (3-1)th channel area CA3-1. The second area A2 may be disposed adjacent to each of the (1-2)th channel area CA1-2 and the second channel area CA2. The third area A3 may be disposed between the (1-1)th channel area CA1-1 and the (1-2)th channel area CA1-2. The fourth area A4 may be disposed adjacent to the second channel area CA2. The fifth area A5 may be disposed adjacent to each of the second channel area CA2 and the (1-2)th channel area CA1-2.

The active layer 100 includes a metal oxide semiconductor (e.g., indium gallium zinc oxide ("IGZO")), an inorganic semiconductor (e.g., amorphous silicon, polysilicon), or an organic semiconductor. In an embodiment, the active layer 100 may include an inorganic semiconductor.

Referring to FIGS. 3, 4, 6 and 7, the display device DD in an embodiment may further include the first conductive layer 200. The first conductive layer 200 may be disposed on the active layer 100. Specifically, a first insulating layer covering the active layer 100 may be disposed on the active layer 100, and the first conductive layer 200 may be disposed on the first insulating layer.

The first conductive layer 200 may include a first gate electrode 201, a second gate electrode 202, a third gate electrode 203, a fourth gate electrode 204, a light emission control line 205, and a bias control line 206. The first gate electrode 201, the second gate electrode 202, the third gate electrode 203, the fourth gate electrode 204, the emission control line 205, and the bias control line 206 may be disposed in the same layer.

The first gate electrode 201 may include a first portion 201a and a second portion 201b. The first portion 201a of the first gate electrode 201 may extend in the second direction DR2, and the second portion 201b of the first gate electrode 201 may extend in the first direction DR1 orthogonal to the second direction DR2.

A portion (i.e., the first area A1, the (1-1)th channel area CA1-1, and a portion of the third area A3) of the first active pattern 101 and the first portion 201a of the first gate electrode 201 overlapping the (1-1)th channel area CA1-1 of the first active pattern 101 may constitute the (3-1)th transistor T3-1. A portion (i.e., the first area A1, the (1-1)th channel area CA1-1, and a portion of the third area A3) of the first active pattern 101 and the second portion 201b of the first gate electrode 201 overlapping the (1-2)th channel area CA1-2 of the first active pattern 101 may constitute the (3-2)th transistor T3-2. The source area of the (3-1)th transistor T3-1 may be the first area A1, and the drain area of the (3-1)th transistor T3-1 may be the third area A3. In addition, the source area of the (3-2)th transistor T3-2 may be the third area A3, and the drain area of the (3-2)th transistor T3-2 may be the second area A2.

The second gate electrode 202 may have an island shape in a plan view. A portion (i.e., the fourth area A4, the second channel area CA2, and the fifth area A5) of the first active pattern 101 and a portion of the second gate electrode 202 overlapping the second channel area CA2 of the first active pattern 101 may constitute the first transistor T1. The source area of the first transistor T1 may be the fourth area A4, and the drain area of the first transistor T1 may be the fifth area A5.

The third gate electrode 203 may include a first portion 203a, a second portion 203b, and a third portion 203c. The first portion 203a of the third gate electrode 203 may extend in the second direction DR2. Each of the second portion 203b and the third portion 203c of the third gate electrode 203 may extend in the first direction DR1. The second portion 203b and the third portion 203c of the third gate electrode 203 may be spaced apart from each other.

A portion of the first active pattern 101 and the first portion 203a of the third gate electrode 203 overlapping the (3-1)th channel area CA3-1 of the first active pattern 101 may constitute the (4-1)th transistor T4-1. A portion of the first active pattern 101 and the second portion 203b of the third gate electrode 203 overlapping the (3-2)th channel area CA3-2 of the first active pattern 101 may constitute the (4-2)th transistor T4-2.

The first active pattern 101 and the portion of the fourth gate electrode 204 overlapping the first active pattern 101 may constitute the second transistor T2.

The light emission control line 205 may extend in the first direction DR1. A portion of the first active pattern 101 and a portion (i.e., a gate electrode) of the emission control line 205 overlapping the first active pattern 101 may constitute the fifth transistor T5. Another portion of the first active pattern 101 and another portion (i.e., a gate electrode) of the emission control line 205 overlapping the first active pattern 101 may constitute the sixth transistor T6.

The bias control line 206 may extend in the first direction DR1. A portion of the first active pattern 101 and a portion (i.e., a gate electrode) of the bias control line 206 overlapping the first active pattern 101 may constitute the seventh transistor T7. Another portion of the second active pattern 102 and another portion (i.e., a gate electrode) of the bias control line 206 overlapping the second active pattern 102 may constitute the eighth transistor T8.

The first conductive layer 200 may include a metal, an alloy, a conductive metal oxide, a transparent conductive material, or the like. These may be used alone or in combination with each other.

Here, the first transistor T1 may be also referred to as a driving transistor. Further, each of the (3-1)th transistor T3-1 and the (4-1)th transistor T4-1 may be also referred to as a (1-1)th switching transistor, and each of the (3-2)th transistor T3-2 and the (4-2)th transistor T4-2 may be also referred to as a (1-2)th switching transistor.

Referring to FIGS. 3, 4, 8 and 9, the display device DD in an embodiment may further include the second conductive layer 300. The second conductive layer 300 may be disposed on the first conductive layer 200. Specifically, an insulating layer may be disposed on the first conductive layer 200, and the second conductive layer 300 may be disposed on the insulating layer.

The second conductive layer 300 may include a capacitor electrode 301 and a repair line 302. The capacitor electrode 301 and the repair line 302 may be disposed in the same layer.

A hole H passing through the capacitor electrode 301 may be defined in the capacitor electrode 301. The hole H may overlap the second gate electrode 202. The third area A3 of the first active pattern 101 and a portion of the capacitor electrode 301 overlapping the third area A3 of the first active pattern 101 may constitute a first node capacitor CN1. A portion of the first active pattern 101 and a portion of the capacitor electrode 301 overlapping the portion of the first active pattern 101 may constitute a second node capacitor CN2.

In addition, the second gate electrode 202 and the portion of the capacitor electrode 301 overlapping the second gate electrode 202 may constitute a storage capacitor CST.

The repair line 302 may extend in the first direction DR1. The repair line 302 may increase the yield of the display device DD. In an embodiment, when a defect occurs in some of lines in the process of manufacturing the display device DD, the repair line 302 may replace the line, for example. The second conductive layer 300 may include a metal, an alloy, a conductive metal oxide, a transparent conductive material, or the like. These may be used alone or in combination with each other.

Referring to FIGS. 3, 4, and 10, the display device DD in an embodiment may further include the third conductive layer 400. The third conductive layer 400 may be disposed on the second conductive layer 300. Specifically, an insulating layer may be disposed on the second conductive layer 300, and the third conductive layer 400 may be disposed on the insulating layer.

The third conductive layer 400 may include a first connection pattern 401, a driving voltage connection pattern 402, a lower anode connection pattern 403, a second connection pattern 404, a data connection pattern 405, an initialization gate line 406, a data write line 407, a compensation gate line 408, an extension line 409, an anode initialization connection line 410, and a bias voltage connection line 411.

The first connection pattern 401, the driving voltage connection pattern 402, the lower anode connection pattern 403, the second connection pattern 404, the data connection pattern 405, the initialization gate line 406, the data write line 407, the compensation gate line 408, the extension line 409, the anode initialization connection line 410, and the bias voltage connection line 411 may be disposed in the same layer.

The first connection pattern 401 may extend in the second direction DR2 orthogonal to the first direction DR1. The first connection pattern 401 may contact the first active pattern 101 and the second active pattern 102, respectively.

The driving voltage connection pattern 402 may extend in the first direction DR1. The driving voltage connection pattern 402 may provide a driving voltage (e.g., the driving voltage ELVDD of FIG. 2) to the first active pattern 101.

The lower anode connection pattern 403 may extend in the first direction DR1. The lower anode connection pattern 403 may contact the first active pattern 101. Accordingly, the lower anode connection pattern 403 may connect the first active pattern 101 and the light-emitting element EL.

The second connection pattern 404 may extend in the second direction DR2. The second connection pattern 404 may contact the first active pattern 101 and the second gate electrode 202, respectively.

The data connection pattern 405 may contact the first active pattern 101. The data connection pattern 405 may provide a data voltage (e.g., the data voltage VDATA of FIG. 2) to the first active pattern 101.

The initialization gate line 406 may extend in the first direction DR1. The initialization gate line 406 may contact the third gate electrode 203. The initialization gate line 406 may provide an initialization gate signal (e.g., the initialization gate signal GI of FIG. 2) to the third gate electrode 203.

The data write line 407 may extend in the first direction DR1. The data write line 407 may contact the fourth gate electrode 204. The data write line 407 may provide a data write signal (e.g., the data write signal GW of FIG. 2) to the fourth gate electrode 204.

The compensation gate line 408 may extend in the first direction DR1. The compensation gate line 408 may overlap the first gate electrode 201. The compensation gate line 408 may provide a compensation gate signal (e.g., the compensation gate signal GC of FIG. 2) to the first gate electrode 201.

The extension line 409 may extend in the first direction DR1. The extension line 409 may contact the bias control line 206.

The anode initialization connection line 410 may extend in the first direction DR1. The anode initialization connection line 410 may contact the first active pattern 101. The anode initialization connection line 410 may provide an anode initialization voltage (e.g., the anode initialization voltage AINT of FIG. 2) to the first active pattern 101.

The bias voltage connection line 411 may extend in the first direction DR1. The bias voltage connection line 411 may contact the second active pattern 102. The bias voltage connection line 411 may provide a bias voltage (e.g., the bias voltage VBIAS of FIG. 2) to the second active pattern 102.

The third conductive layer 400 may include a metal, an alloy, a conductive metal oxide, a transparent conductive material, or the like. These may be used alone or in combination with each other.

Referring to FIGS. 3, 4, and 11, the display device DD in an embodiment may further include a fourth conductive layer 500. The fourth conductive layer 500 may be disposed on the third conductive layer 400. Specifically, an insulating layer may be disposed on the third conductive layer 400, and the fourth conductive layer 500 may be disposed on the insulating layer.

The fourth conductive layer 500 may include a data line 501, a driving voltage line 502, an initialization voltage line 503, and an upper anode connection pattern 504. The data line 501, the driving voltage line 502, the anode initialization voltage line 503, and the upper anode connection pattern 504 may be disposed in the same layer.

The data line 501 may extend in a second direction DR2 orthogonal to the first direction DR1. The data line 501 may contact the data connection pattern 405. The data line 501 may provide a data voltage (e.g., the data voltage VDATA of FIG. 2) to the first active pattern 101.

The driving voltage line 502 may extend in the second direction DR2. The driving voltage line 502 may contact the driving voltage connection pattern 402. The driving voltage line 502 may provide a driving voltage (e.g., the driving voltage ELVDD of FIG. 2) to the first active pattern 101.

The anode initialization voltage line 503 may extend in the second direction DR2. The anode initialization voltage line 503 may contact the anode initialization connection line 410. The initialization voltage line 503 may provide an anode initialization voltage (e.g., the anode initialization voltage AINT of FIG. 2) to the first active pattern 101.

The upper anode connection pattern 504 may contact the lower anode connection pattern 403. Accordingly, the upper anode connection pattern 504 may connect the first active pattern 101 and the light-emitting element EL.

The fourth conductive layer 500 may include a metal, an alloy, a conductive metal oxide, a transparent conductive material, or the like. These may be used alone or in combination with each other.

Figure 12:
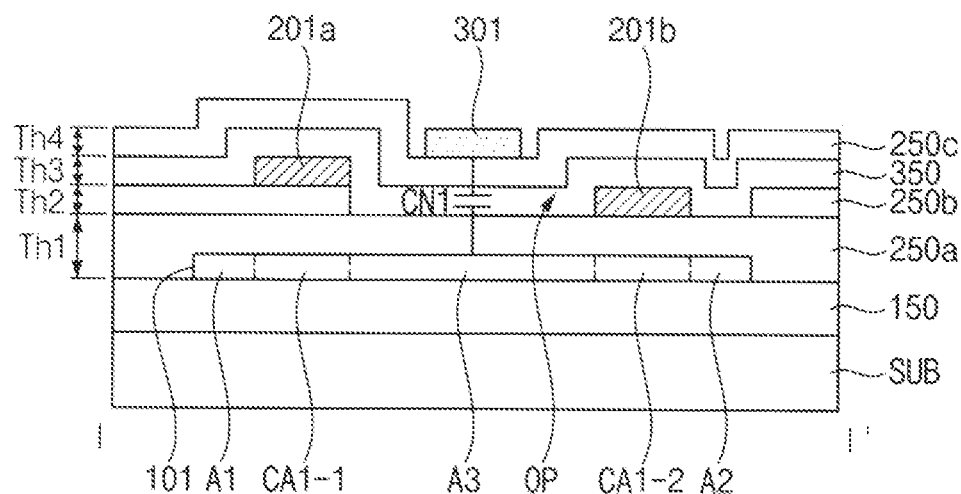
FIG. 12 is a cross-sectional view taken along line I-I' of FIG. 9.
Figure 13:
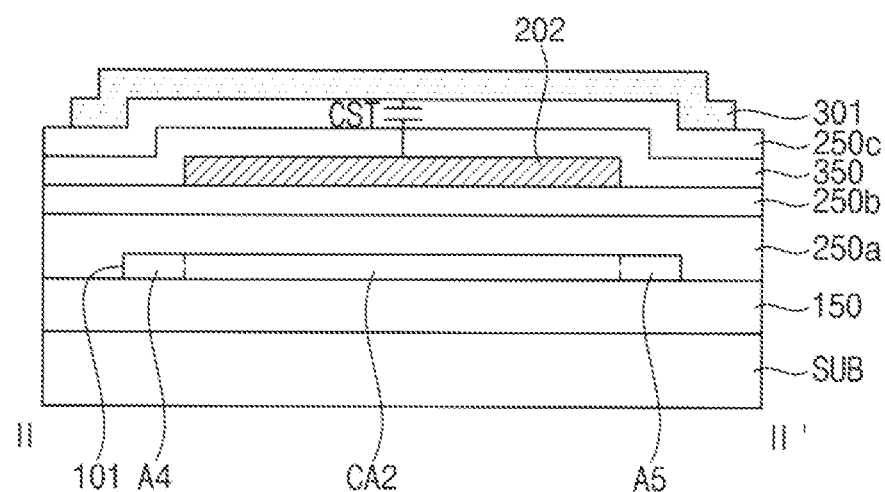
FIG. 13 is a cross-sectional view taken along line II-II' of FIG. 9.

FIG. 12 is a cross-sectional view taken along line I-I' of FIG. 9. FIG. 13 is a cross-sectional view taken along line II-II' of FIG. 9. However, although cross-sectional structures of the (3-1)th and (3-2)th transistors T3-1 and T3-2 are illustrated in FIG. 12, the invention is not limited thereto. In an embodiment, the cross-sectional structures of the (4-1)th and (4-2)th transistors T4-1 and T4-2 of FIGS. 2 and 7 may be substantially the same as the cross-sectional structure of the (3-1)th and (3-2)th transistors T3-1 and T3-2 of FIG. 12, for example.

Referring to FIGS. 9, 12, and 13, a buffer layer 150 may be disposed on the substrate SUB. The buffer layer 150 may prevent diffusion of impurities from the substrate to the active layer 100. In addition, the buffer layer 150 may control the transfer rate of heat generated in the process of forming the active layer 100. Accordingly, the active layer 100 may be uniformly formed or provided. In an embodiment, the buffer layer 150 may include an organic material or an inorganic material, for example.

The active layer 100 may be disposed on the buffer layer 150. Specifically, the first active pattern 101 of the active layer 100 may be disposed on the buffer layer 150.

The first active pattern 101 may include the first area A1, the second area A2, the (1-1)th channel area CA1-1, the (1-2)th channel area CA1-2, and the third area A3 disposed between the (1-1)th channel area CA1-1 and the (1-2)th channel area CA1-2. In addition, the first active pattern 101 may further include the fourth area A4, the fifth area A5, and the second channel area CA2 disposed between the fourth area A4 and the fifth area A5. Impurities may be doped in the first area A1, the second area A2, the third area A3, the fourth area A4, and the fifth area A5.

A first insulating layer 250a may be disposed on the buffer layer 150. The first insulating layer 250a may sufficiently cover the first active pattern 101. The first insulating layer 250a may include an inorganic material. In an embodiment, the first insulating layer 250a may include silicon oxide ($SiO_x$), silicon nitride ($SiN_x$), silicon oxynitride ($SiO_xN_y$), or the like, for example. These may be used alone or in combination with each other. In an embodiment, the first insulating layer 250a may include silicon oxide.

A second insulating layer 250b may be disposed on the first insulating layer 250a. The second insulating layer 250b may include an inorganic material. In an embodiment, the second insulating layer 250b may include silicon oxide, silicon nitride, silicon oxynitride, or the like, for example. These may be used alone or in combination with each other. In an embodiment, the second insulating layer 250b may include silicon nitride.

An opening OP overlapping a portion of the first active pattern 101 may be defined in the second insulating layer 250b. In an embodiment, the opening OP may overlap the second area A2, the (1-2)th channel area CA1-2, and the third area A3 of the first active pattern 101. That is, the opening OP may not overlap the first area A1 and the (1-1)th channel area CA1-1 of the first active pattern 101.

The thickness Th1 of the first insulating layer 250a may be different from the thickness of the second insulating layer 250b. In an embodiment, the thickness Th2 of the second insulating layer 250b may be smaller than the thickness Th1 of the first insulating layer 250a, for example. In an embodiment, the thickness Th1 of the first insulating layer 250a may be about 800 Å to about 1,400 Å, and the thickness Th2 of the second insulating layer 250b may be about 200 Å to about 600 Å.

The first gate electrode 201 may be disposed on the first insulating layer 250a. In addition, the second gate electrode 202 may be disposed on the second insulating layer 250b. The first portion 201a of the first gate electrode 201 may overlap the (1-1)th channel area CA1-1 and may be disposed on the second insulating layer 250b. The second portion 201b of the first gate electrode 201 may overlap the (1-2)th channel area CA1-2 and may be disposed on the first insulating layer 250a. Specifically, the second portion 201b of the first gate electrode 201 may be disposed inside the opening OP of the second insulating layer 250b.

In an embodiment, a high dielectric layer 350 may be disposed on the first insulating layer 250a and the second insulating layer 250b. The high dielectric layer 350 may cover the first gate electrode 201 and the second gate electrode 202, and may fill the opening OP of the second insulating layer 250b.

In an embodiment, the high dielectric layer 350 may include an inorganic material having a high dielectric constant, for example. In an embodiment, the high dielectric layer 350 may include aluminum oxide ($Al_2O_3$), zirconium oxide (ZrO), hafnium oxide ($HfO_2$), or the like. These may be used alone or in combination with each other. However, the configuration of the invention is not limited thereto, and the high dielectric layer 350 may include another inorganic material having a high dielectric constant.

In an embodiment, the high dielectric layer 350 may have a thickness Th3 of about 300 Å to about 1,000 Å.

A third insulating layer 250c may be disposed on the high dielectric layer 350. The third insulating layer 250c may include an inorganic material. In an embodiment, the third insulating layer 250c may include silicon oxide, silicon nitride, silicon oxynitride, or the like, for example. These may be used alone or in combination with each other. In an embodiment, the third insulating layer 250c may include silicon nitride.

In an embodiment, the thickness Th4 of the third insulating layer 250c may be about 500 Å to about 1,400 Å.

The capacitor electrode 301 may be disposed on the third insulating layer 250c. A portion of the capacitor electrode 301 may partially overlap the third area A3 of the first active pattern 101. In addition, another portion of the capacitor electrode 301 may partially overlap the second gate electrode 202.

In order to reduce the leakage current flowing through the switching transistors (e.g., the (3-1)th and (3-2)th transistors or the (4-1)th and (4-2)th transistors of FIGS. 2 and 7), the number of defects in the first active pattern 101 is desired to be small. In addition, in order to secure a wide driving range of the driving transistor (e.g., the first transistor T1 of FIG. 2), the first active pattern 101 is desired to have many defects. That is, the leakage current flowing through the switching transistors and the driving range of the driving transistor may have a trade-off relationship. In an embodiment, when the first active pattern 101 has many defects, the leakage current flowing through the switching transistors may increase, and the wide driving range of the driving transistor may be secured, for example.

The display device DD in an embodiment of the disclosure may include the second insulating layer 250b which is disposed on the substrate SUB and in which the opening OP overlapping a portion (i.e., the second area A2, the (1-2)th channel area CA1-2, and a portion of the third area A3) of the first active pattern 101 constituting the (1-2)th switching transistor is defined, and the high dielectric layer 350 filling the opening OP and including a material with a high dielectric constant. A node capacitor (e.g., the first node capacitor CN1 or the second node capacitor CN2 of FIG. 9) may be increased. In this case, since the leakage current flowing through the (1-2)th switching transistor is greater than the leakage current flowing through the (1-1)th switching transistor, the leakage current flowing through the (1-1)th switching transistor may be reduced. In addition, the wide driving range of the driving transistor may be secured. That is, the wide driving range of the driving transistor may be secured while the leakage current flowing through the switching transistors is reduced.

FIGS. 14, 15, 16, 17, 18, 19, and 20 are cross-sectional views illustrating an embodiment of a method of manufacturing a display device.

Figure 14:
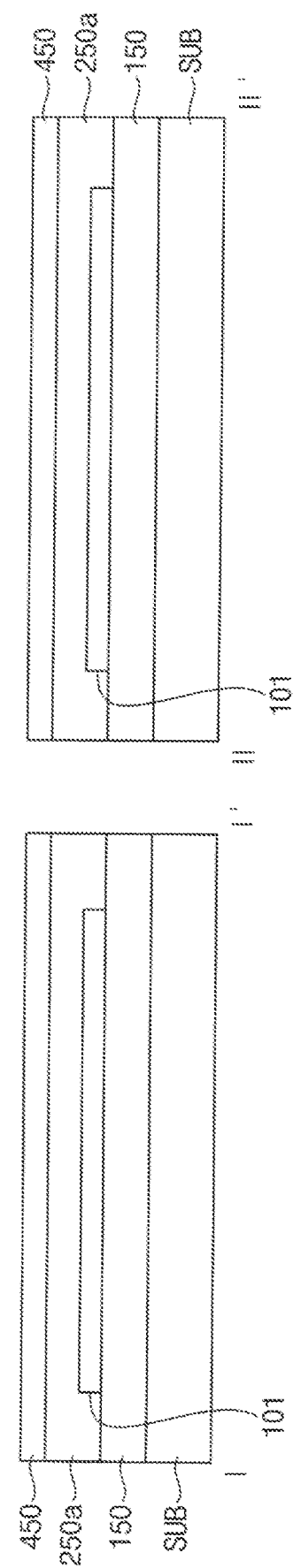

Referring to FIG. 14, the buffer layer 150 may be formed or disposed on a substrate SUB including a transparent material or an opaque material. In an embodiment, the buffer layer 150 may be formed or provided using an organic material or an organic material, for example.

The first active pattern 101 may be formed or disposed on the buffer layer 150. In an embodiment, the first active pattern 101 may be formed or provided using polysilicon, amorphous silicon, or the like, for example.

The first insulating layer 250a may be formed or disposed on the buffer layer 150. The first insulating layer 250a may sufficiently cover the first active pattern 101. In an embodiment, the first insulating layer 250a may be formed or provided using silicon oxide, silicon nitride, silicon oxynitride, or the like, for example.

The insulating layer 450 may be formed or disposed on the first insulating layer 250a. The insulating layer 450 may be formed or disposed on an entirety of the first insulating layer 250a. The insulating layer 450 may be formed or provided using silicon oxide, silicon nitride, or the like.

Figure 15:
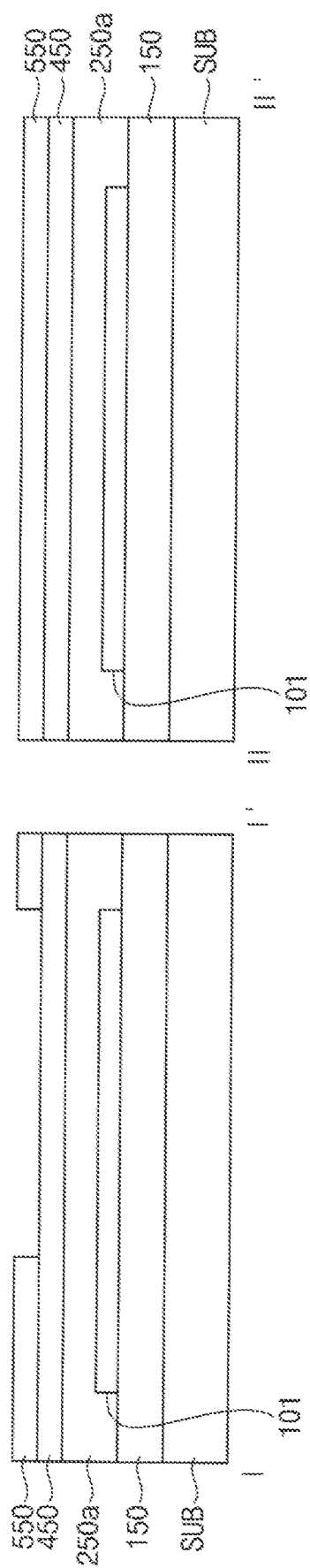

Referring to FIG. 15, a photoresist layer 550 may be formed or disposed on the insulating layer 450. The photoresist layer 550 may be formed or provided using a photoresist. An opening overlapping a portion of the first active pattern 101 may be defined in the photoresist layer 550. The opening may overlap a portion of the first active pattern 101 constituting the (3-2)th transistor (e.g., the 3-2 transistor T3-2 of FIG. 7).

Referring to FIG. 16, a portion of the insulating layer 450 may be removed using the photoresist layer 550 as a mask. Specifically, a portion of the insulating layer 450 overlapping the opening of the photoresist layer 550 may be removed. In an embodiment, the portion of the insulating layer 450 may be removed through a dry etch process or a wet etch process. Accordingly, the second insulating layer 250b in which the opening OP overlapping the opening of the photoresist layer 550 is defined may be formed or provided.

Figure 17:
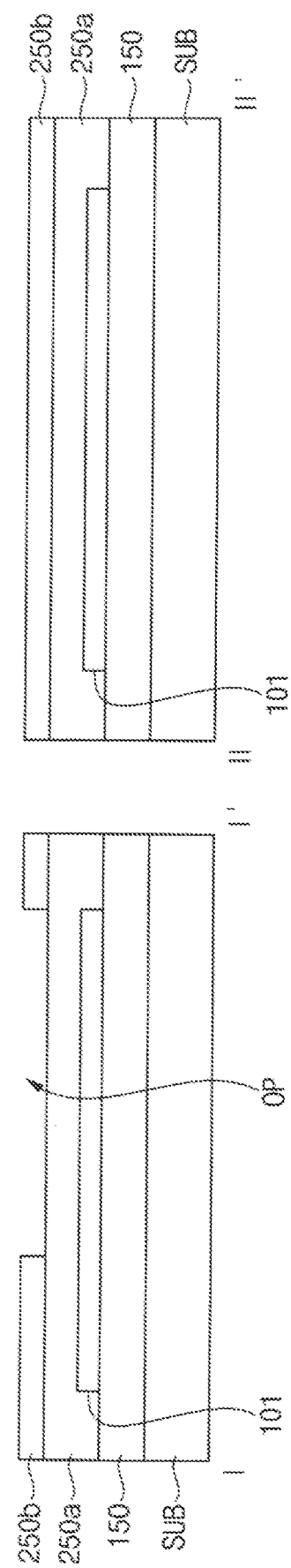
Figure 18:
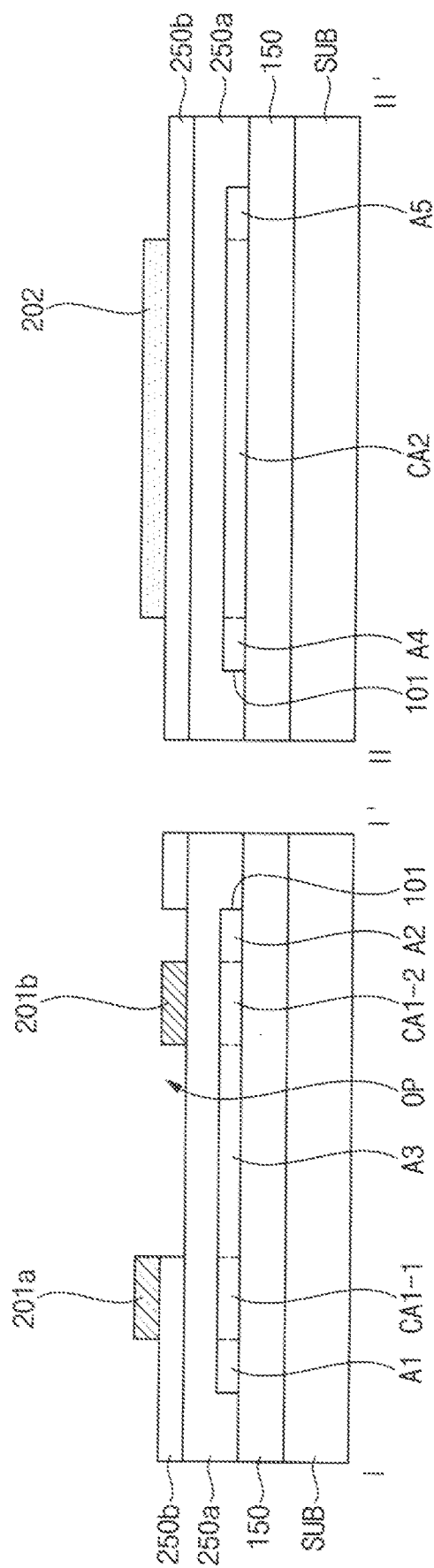

Referring to FIGS. 7, 17, and 18, the photoresist layer 550 may be removed.

The second gate electrode 202 may be formed or disposed on the second insulating layer 250b, and the first gate electrode 201 may be formed or disposed on the first insulating layer 250a. Specifically, the first portion 201a of the first gate electrode 201 may be formed or disposed on the second insulating layer 250b, and the second portion 201b of the first gate electrode 201 may be formed or disposed on the first insulating layer 250a. In an embodiment, each of the first gate electrode 201 and the second gate electrode 202 may be formed or provided using a metal, an alloy, a conductive metal oxide, a transparent conductive material, or the like, for example.

A portion of the first active pattern 101 may be doped with impurities using the first gate electrode 201 as a mask. Accordingly, the (1-1)th channel area CA1-1, the (1-2)th channel area CA1-2, the first area A1, the second area A2, and the third area A3 may be formed or provided in the first active pattern 101. The first portion 201a of the first gate electrode 201 may overlap the (1-1)th channel area CA1-1, and the second portion 201b of the first gate electrode 201 may overlap the (1-2)th channel area CA1-2. The opening OP of the second insulating layer 250b may overlap the second area A2, the (1-2)th channel area CA1-2, and the portion of the third area A3 of the first active pattern 101.

At the same time, a portion of the first active pattern 101 may be doped with impurities using the second gate electrode 202 as a mask. Accordingly, the fourth area A4, the fifth area A5, and the second channel area CA2 disposed between the fourth area A4 and the fifth area A5 may be formed or provided in the first active pattern 101. The second gate electrode 202 may overlap the second channel area CA2.

Figure 19:
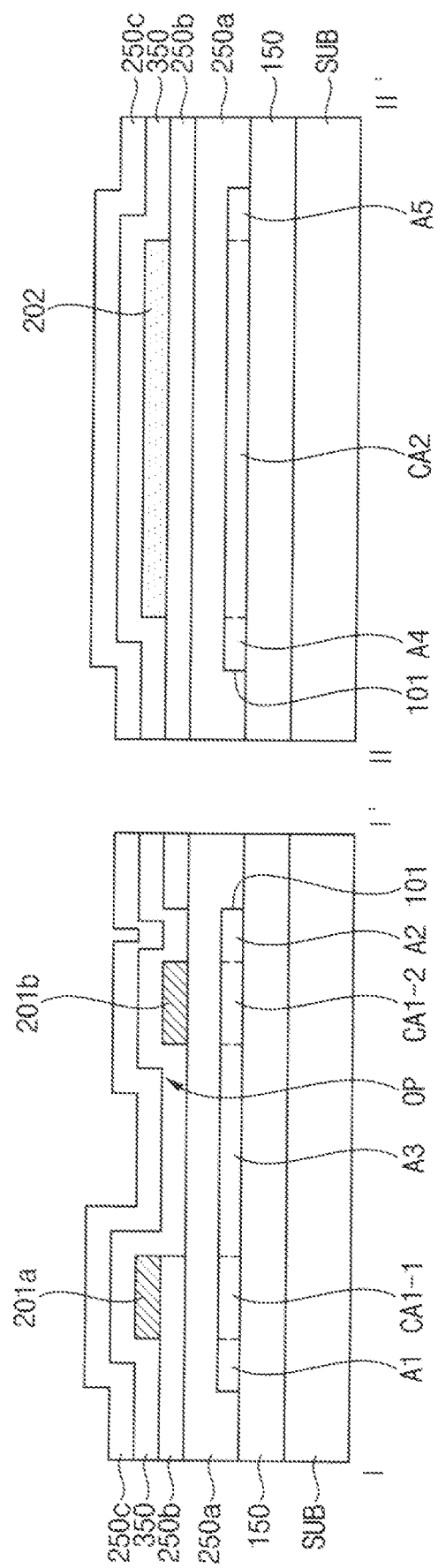

Referring to FIG. 19, the high dielectric layer 350 may be formed or disposed on the second insulating layer 250b. The high dielectric layer 350 may sufficiently cover the first gate electrode 201 and the second gate electrode 202. In an embodiment, the high dielectric layer 350 may be formed or provided using aluminum oxide, zirconium oxide, hafnium oxide, or the like, for example. The third insulating layer 250c may be formed or disposed on the high dielectric layer 350. In an embodiment, the third insulating layer 250c may be formed or provided using silicon oxide, silicon nitride, silicon oxynitride, or the like, for example.

Figure 20:
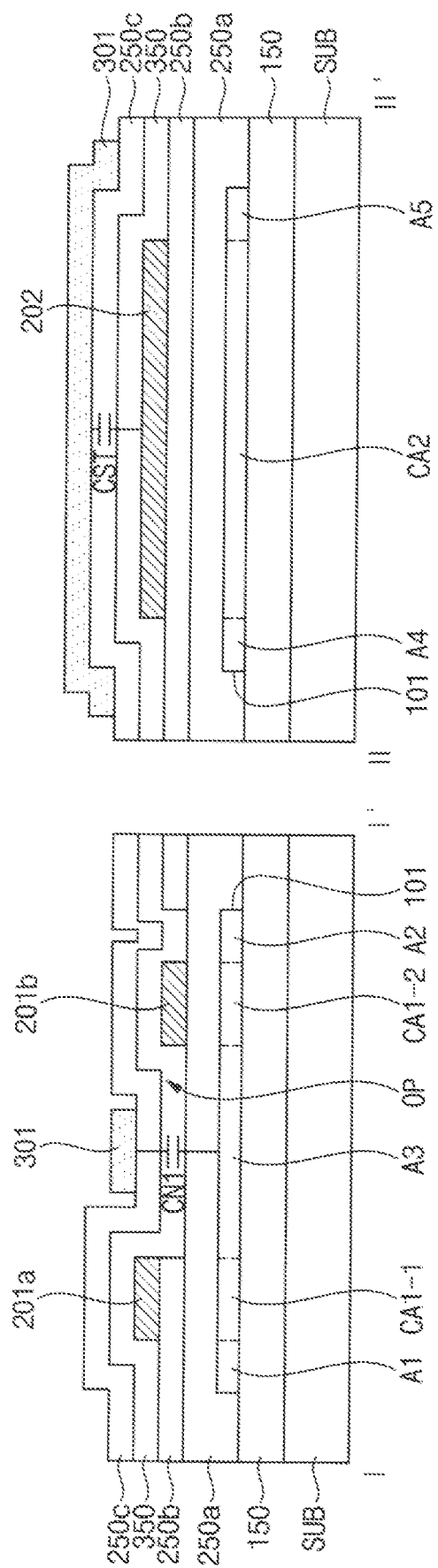

Referring to FIG. 20, the capacitor electrode 301 may be formed or disposed on the third insulating layer 250c. At least a portion of the capacitor electrode 301 may form the first node capacitor CN1 together with the third area A3 of the first active pattern 101. In addition, a portion of the capacitor electrode 301 overlapping the second gate electrode 202 may form a storage capacitor CST together with the second gate electrode 202. In an embodiment, the capacitor electrode 301 may be formed or provided using a metal, an alloy, a conductive metal oxide, a transparent conductive material, or the like, for example.

Embodiments of the disclosure may be applied to a display device and an electronic device including the same. In an embodiment, the invention may be applied to high-resolution smartphones, mobile phones, smart pads, smart watches, tablet personal computers, vehicle navigation systems, televisions, computer monitors, notebook computers, or the like, for example.

The foregoing is illustrative of embodiments and is not to be construed as limiting thereof. Although illustrative embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the predetermined embodiments disclosed, and that modifications to the disclosed embodiments, as well as other embodiments, are intended to be included within the scope of the appended claims.

What is claimed is:

1. A display device comprising:
   a substrate;
   an active pattern disposed on the substrate, and including a first area, a second area, a (1-1)th channel area, a (1-2)th channel area, and a third area disposed between the (1-1)th channel area and the (1-2)th channel area;
   a first insulating layer disposed on the substrate and contacting the active pattern;
   a second insulating layer which is directly disposed on the first insulating layer and in which an opening overlapping the (1-2)th channel area, the second area, and the third area is defined;
   a first gate electrode disposed on the first insulating layer and overlapping the (1-1)th channel area the (1-2)th channel area, respectively; and
   a high dielectric layer disposed on the first insulating layer, covering the first gate electrode, and filling the opening.

2. The display device of claim 1, wherein the high dielectric layer includes at least one of aluminum oxide ($Al_2O_3$), zirconium oxide (ZrO), and hafnium oxide ($HfO_2$).

3. The display device of claim 1, wherein the first insulating layer and the second insulating layer include different inorganic materials.

4. The display device of claim 3, wherein the first insulating layer includes silicon oxide ($SiO_x$) and the second insulating layer includes silicon nitride ($SiN_x$).

5. The display device of claim 1, wherein a thickness of the first insulating layer is different from a thickness of the second insulating layer.

6. The display device of claim 5, wherein the thickness of the first insulating layer is about 800 angstroms to about 1,400 angstroms and the thickness of the second insulating layer is about 200 angstroms to about 600 angstroms.

7. The display device of claim 1, wherein a thickness of the high dielectric layer is about 300 angstroms to about 1,000 angstroms.

8. The display device of claim 1, wherein the first gate electrode includes:
   a first portion overlapping the (1-1)th channel area and disposed on the second insulating layer; and
   a second portion overlapping the (1-2)th channel area and disposed on the first insulating layer.

9. The display device of claim 8, wherein the first portion of the first gate electrode together with first area, the (1-1)th channel area, and a portion of the third area of the active pattern constitutes a (1-1)th switching transistor, and
   wherein the second portion of the first gate electrode together with the second area, the (1-2)th channel area, and a portion of the third area of the active pattern constitutes a (1-2)th switching transistor.

10. The display device of claim 1, further comprising:
    a third insulating layer disposed on the high dielectric layer and including at least one of silicon oxide, silicon nitride, and silicon oxynitride; and
    a capacitor electrode disposed on the third insulating layer.

11. The display device of claim 10, wherein a thickness of the third insulating layer is about 500 angstroms to about 1,400 angstroms.

12. The display device of claim 10, wherein a portion of the capacitor electrode overlapping the third area of the active pattern together with the third area of the active pattern constitutes a node capacitor.

13. The display device of claim 10, wherein the active pattern further includes:
    a fourth area, a fifth area, and a second channel area disposed between the fourth area and the fifth area.

14. The display device of claim 13, further comprising:
    a second gate electrode disposed in a same layer as the first gate electrode, overlapping the second channel area, and covered by the high dielectric layer,
    wherein the second gate electrode together with the fourth area, the fifth area, and the second channel area of the active pattern constitutes a driving transistor.

15. The display device of claim 14, wherein a portion of the capacitor electrode overlapping the second gate electrode together with the second gate electrode constitutes a storage capacitor.

16. The display device of claim 1, wherein the active pattern includes at least one of polysilicon and amorphous silicon.

17. A display device comprising:
    a substrate;
    an active pattern disposed on the substrate, and including a first area, a second area, a (1-1)th channel area, a (1-2)th channel area, and a third area disposed between the (1-1)th channel area and the (1-2)th channel area;
    a first insulating layer disposed on the substrate and contacting the active pattern;
    a second insulating layer which is disposed directly on the first insulating layer and in which an opening overlapping the (1-2)th channel area, the second area, and the third area is defined;
    a capacitor electrode disposed on the first insulating layer, at least a portion of the capacitor electrode constituting a node capacitor together with the third area of the active pattern; and
    a high dielectric layer disposed between the first insulating layer and the capacitor electrode and filling the opening,
    wherein an entirety of an upper surface of the third area is covered by the first insulating layer.

18. The display device of claim 17, wherein the high dielectric layer includes at least one of aluminum oxide ($Al_2O_3$), zirconium oxide (ZrO), and hafnium oxide ($HfO_2$).

19. The display device of claim 17, further comprising:
    a gate electrode including:
       a first portion disposed between the second insulating layer and the high dielectric layer and overlapping the (1-1)th channel area; and
       a second portion disposed between the first insulating layer and the high dielectric layer and overlapping the (1-2)th channel area.

20. The display device of claim 19, wherein the first portion of the first gate electrode together with first area, the (1-1)th channel area, and a portion of the third area of the active pattern constitutes a (1-1)th switching transistor, and wherein the second portion of the first gate electrode together with the second area, the (1-2)th channel area, and a portion of the third area of the active pattern constitutes a (1-2)th switching transistor.

\* \* \* \* \*